(12) United States Patent
Liu et al.

(10) Patent No.: US 11,605,346 B2
(45) Date of Patent: Mar. 14, 2023

(54) CIRCUIT TO GENERATE DATA SIGNAL CURRENT AND DISPLAY PANEL

(71) Applicant: SEEYA OPTRONICS CO., LTD, Shanghai (CN)

(72) Inventors: Ping-Lin Liu, Shanghai (CN); Haodong Zhang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/560,379

(22) Filed: Dec. 23, 2021

(65) Prior Publication Data
US 2022/0122536 A1    Apr. 21, 2022

Related U.S. Application Data

(63) Continuation of application No. 17/015,416, filed on Sep. 9, 2020, now abandoned.

(30) Foreign Application Priority Data

May 29, 2020    (CN) .......................... 202010472026.1

(51) Int. Cl.
G09G 3/3233    (2016.01)
G09G 3/3258    (2016.01)
(Continued)

(52) U.S. Cl.
CPC ......... *G09G 3/3233* (2013.01); *G09G 3/3258* (2013.01); *G09G 3/3283* (2013.01);
(Continued)

(58) Field of Classification Search
CPC .. G09G 3/3233; G09G 3/3258; G09G 3/3283; G09G 2320/0233; G09G 2310/08;
(Continued)

(56) References Cited

U.S. PATENT DOCUMENTS 9,501,978 B2    11/2016    Park
9,972,647 B2    5/2018    Umezaki
(Continued)

FOREIGN PATENT DOCUMENTS

CN    1553424 A    12/2004
CN    1573877 A    2/2005
(Continued)

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*
(Continued)

*Primary Examiner* — Jeff Piziali
(74) *Attorney, Agent, or Firm* — Duane Morris LLP

(57) ABSTRACT

The present disclosure describes a display panel and a circuit to generate a data signal current included thereof. The circuit further comprises a signal voltage module to generate a primary signal voltage and send to a second storage capacitor in a control module to output a data signal voltage. The second storage capacitor is coupled to a first storage capacitor and a gate of a current output transistor, so that the primary signal voltage is stored at the joint node. A threshold voltage of the current output transistor, generated by a voltage compensation module, is then added on to the gate of the current output transistor, so that an output current compensated by the threshold voltage is realized.

5 Claims, 8 Drawing Sheets

(51) Int. Cl.
*G09G 3/3283* (2016.01)
*H03K 17/687* (2006.01)
*G09G 3/3266* (2016.01)

(52) U.S. Cl.
CPC ....... *H03K 17/6871* (2013.01); *G09G 3/3266* (2013.01); *G09G 2300/0439* (2013.01); *G09G 2300/0809* (2013.01); *G09G 2310/0243* (2013.01); *G09G 2310/08* (2013.01); *G09G 2320/0233* (2013.01)

(58) Field of Classification Search
CPC ......... G09G 2300/0439; G09G 3/3266; G09G 2300/0809; H03K 17/6871
See application file for complete search history.

(56) References Cited

U.S. PATENT DOCUMENTS

| | | | |
|---|---|---|---|
| 2003/0122745 A1* | 7/2003 | Miyazawa | G09G 3/3233 345/76 |
| 2005/0140605 A1 | 6/2005 | Jung | |
| 2005/0243040 A1 | 11/2005 | Miyazawa | |
| 2006/0132055 A1 | 6/2006 | Kwak | |
| 2006/0232183 A1* | 10/2006 | Park | G09G 3/3291 313/483 |
| 2007/0064469 A1* | 3/2007 | Umezaki | G09G 3/325 365/154 |
| 2007/0273619 A1 | 11/2007 | Kitazawa et al. | |
| 2012/0162275 A1* | 6/2012 | Park | G09G 3/3233 445/24 |
| 2012/0268194 A1 | 10/2012 | Koyama | |
| 2013/0093737 A1* | 4/2013 | Ota | G09G 3/3275 345/204 |
| 2013/0120338 A1* | 5/2013 | Kubota | G09G 3/3208 257/E33.044 |
| 2014/0307010 A1* | 10/2014 | Han | G09G 3/003 345/82 |
| 2015/0310834 A1* | 10/2015 | Hu | G09G 3/3291 345/82 |
| 2015/0379933 A1 | 12/2015 | Kubota et al. | |
| 2017/0047008 A1 | 2/2017 | Lee et al. | |
| 2018/0226022 A1 | 8/2018 | Wu | |
| 2018/0350302 A1 | 12/2018 | Han | |

FOREIGN PATENT DOCUMENTS

| | | |
|---|---|---|
| CN | 1734540 A | 2/2006 |
| CN | 1790913 A | 6/2006 |
| CN | 202067514 U | 12/2011 |

OTHER PUBLICATIONS

Office Action and Search Report dated Jul. 13, 2020 for corresponding Chinese Patent Application No. 202010472026.1.

* cited by examiner

--Prior Art--

--Prior Art--

--Prior Art--

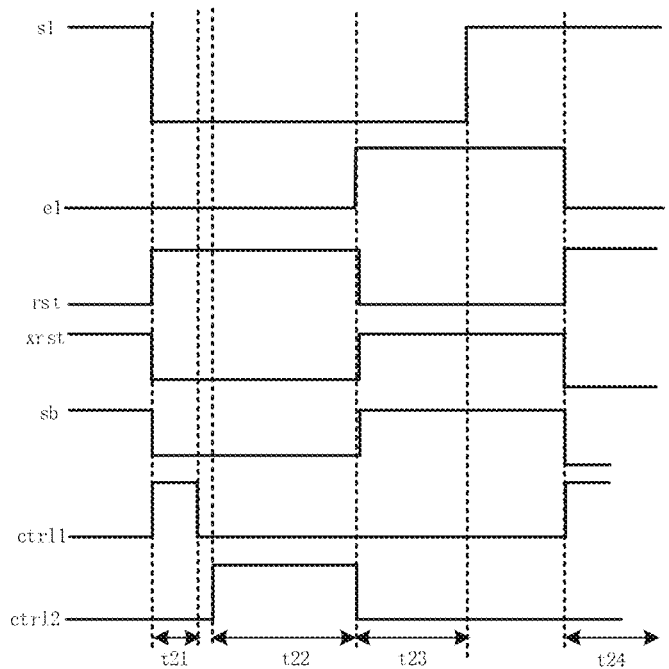

FIG. 12

```
┌─────────────────────────────────────────────────────────┐
│ In a first phase, a voltage module of a circuit to generate a data signal │
│ current is controlled to output a data signal voltage to a control module to │
│ output a data signal voltage, and a compensation control module is │
│ controlled to provide a threshold voltage of a current output transistor to a │
│ gate of the current output transistor │
└─────────────────────────────────────────────────────────┘
                              │
┌─────────────────────────────────────────────────────────┐
│ In a second phase, the control module to output a data signal voltage is │
│ controlled to output the data signal voltage to the gate of the current output │
│ transistor, and the current output transistor outputs a driving data current │
│ based on the data signal voltage of the gate │
└─────────────────────────────────────────────────────────┘
```
S31

CIRCUIT TO GENERATE DATA SIGNAL CURRENT AND DISPLAY PANEL

CROSS-REFERENCE TO RELATED APPLICATIONS

The present application is based upon and claims the benefit of priority of Chinese Patent Application No. 202010472026.1, filed on May 29, 2020, the entire contents of which is incorporated herein by reference.

TECHNICAL FIELD

Embodiments of the present invention relate to the field of display technologies, and in particular, to a circuit to generate a data signal current and a display panel.

BACKGROUND

A pixel driving circuit of a current type includes a circuit to generate a pixel driving current that provides a data signal current for a pixel circuit. The circuit to generate a pixel driving current can convert a data signal voltage into a data signal current and provide the data signal current for the pixel circuit. In a process in which the circuit to generate a pixel driving current converts the data signal voltage into the data signal current, because a transistor that generates the data signal current has a threshold voltage, the converted data signal current deviates from the data signal voltage to some extent, resulting in poor uniformity of a display panel.

SUMMARY

Embodiments of the present invention provide a circuit to generate a data signal current, including a voltage module to generate a data signal voltage, a control module to output a data signal voltage, a compensation control module, a first capacitor, and a current output transistor;

the voltage module is connected to the control module, and is configured to output a data signal voltage to the control module; the control module includes at least one second capacitor, a second terminal of the second capacitor is connected to a first power supply terminal of the circuit, and the second capacitor is configured to store the data signal voltage;

the control module is connected to a gate of the current output transistor, and is configured to output the data signal voltage to the gate of the current output transistor; and the compensation control module is connected between the gate and a first terminal of the current output transistor; the compensation control module is configured to provide the gate of the current output transistor with its own threshold voltage; a first terminal of the first capacitor is connected to the gate of the current output transistor, and a second terminal of the first capacitor is connected to the first power supply terminal, so that the first capacitor stores the voltage of the gate of the current output transistor; and the current output transistor is configured to output the data signal current based on the data signal voltage of its gate.

In the technical solutions of the embodiments of the present invention, the circuit to generate a data signal current includes the control module to output a data signal voltage, the compensation control module, and the first capacitor, and the control module to output a data signal voltage includes the second capacitor. The second capacitor stores the data signal voltage, the compensation control module provides the gate of the current output transistor with its own threshold voltage, and the first capacitor stores the voltage of the gate of the current output transistor. In a working process of the circuit, the second capacitor in the control module stores the data signal voltage, and the compensation control module controls the first capacitor to store the threshold voltage of the current output transistor and output to the gate of the current output transistor; then, the second capacitor in the control module to output a data signal voltage and the first capacitor are connected in parallel, so that the voltage of the gate of the current output transistor is related to the threshold voltage of the current output transistor, and when the current output transistor outputs the data signal current, impact of the threshold voltage of the current output transistor on the data signal current is compensated. In this way, a matching degree of the data signal voltage and the data signal current can be improved, so that uniformity of a display panel is improved.

BRIEF DESCRIPTION OF DRAWINGS

FIG. 12 is a sequence diagram of the circuit to generate a data signal current in FIG. 11; and FIG. 13 is a flowchart of a method for driving a circuit to generate a data signal current according to an embodiment of the present invention.

DESCRIPTION OF EMBODIMENTS

The present invention is further described in detail with reference to the accompanying drawings and the embodiments. It can be understood that the specific embodiments described herein are merely used to explain the present invention but are not intended to limit the present invention. It should be further noted that, for ease of description, only parts related to the present invention rather than all structures are shown in the accompanying drawings.

Figure 1:
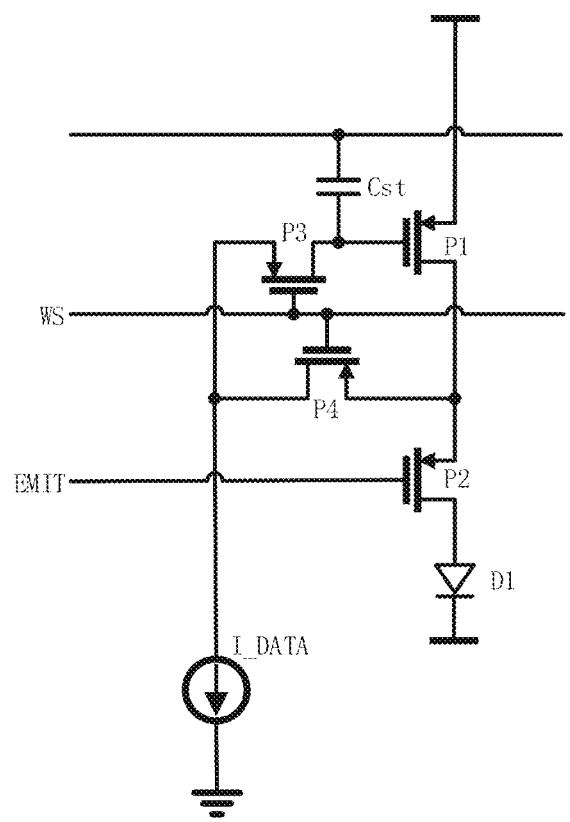
FIG. 1 is a schematic structural diagram of an existing pixel circuit.
Figure 2:
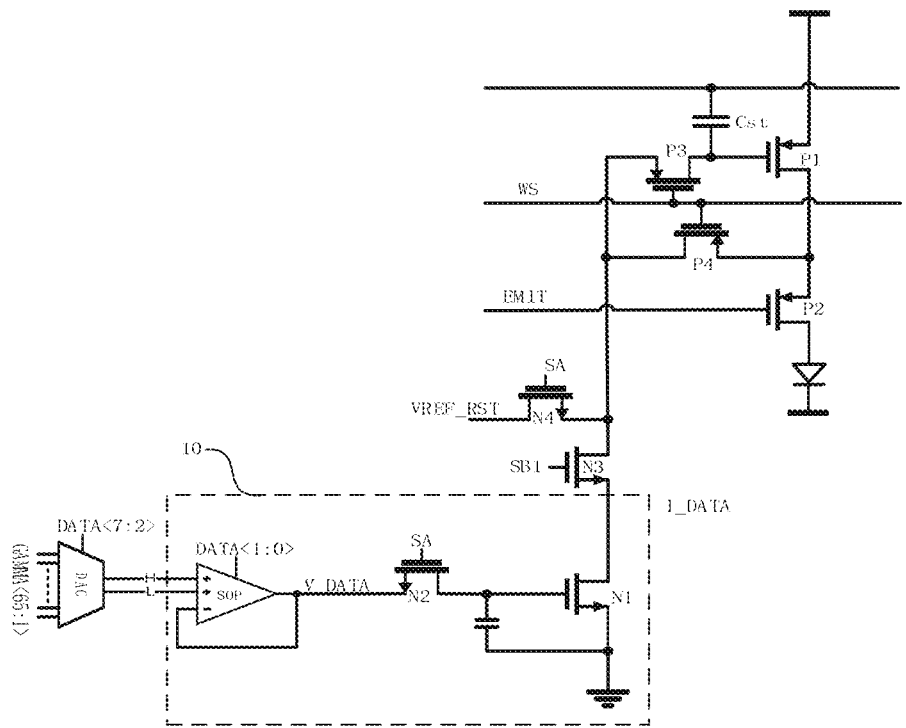
FIG. 2 is a schematic structural diagram of an existing circuit to generate a data signal current that provides a data signal current for a pixel circuit.
Figure 3:
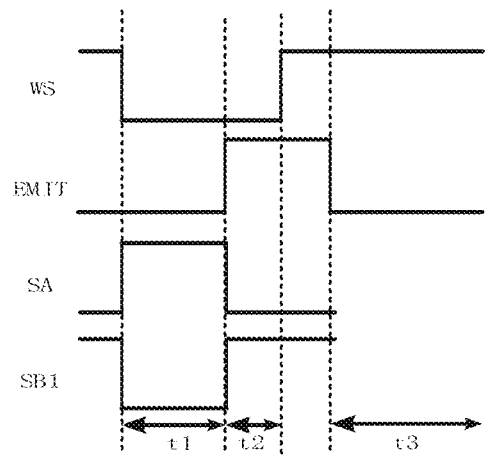
FIG. 3 is a sequence diagram of the circuit to generate a data signal current in FIG. 2.

FIG. 1 is a schematic structural diagram of an existing pixel circuit. As shown in FIG. 1, the pixel circuit includes a first P-type transistor P1, a second P-type transistor P2, a third P-type transistor P3, a fourth P-type transistor P4, a storage capacitor Cst, and a light-emitting device D1. In a data writing phase of working of the pixel circuit, a scanning signal line WS outputs a scanning signal to control the third P-type transistor P3 and the fourth P-type transistor P4 to be turned on, and the first P-type transistor P1 is in a diode state, so that a data signal current I_DATA is written into a gate of the first P-type transistor P1 through the third P-type transistor P3 and the fourth P-type transistor P4 and is maintained by the storage capacitor Cst. In a light-emitting phase of working of the pixel circuit, a light-emitting control signal line EMIT controls the second P-type transistor P2 to be turned on, forming a data signal current path, and the first P-type transistor P1 outputs a data signal current to drive the light-emitting device D1 to emit light. FIG. 2 is a schematic structural diagram of an existing circuit to generate a data signal current that provides a data signal current for a pixel circuit. FIG. 3 is a sequence diagram of the circuit to generate a data signal current in FIG. 2. As shown in FIG. 2, a circuit 10 to generate a data signal current includes a source operational amplifier (SOP), a first N-type transistor N1, and a second N-type transistor N2. The circuit 10 to generate a data signal current is connected to the pixel circuit through a data line. The data line further includes a third N-type transistor N3 that serves as a switch, and a fourth N-type transistor N4 that is used for resetting.

With reference to FIG. 2 and FIG. 3, in a working process of the driving pixel circuit, a first level and a second level that are output by a digital to analog converter (DAC) are input to an input terminal of the source operational amplifier SOP. A gamma voltage is input to an input terminal of the digital to analog converter DAC. When the gamma voltage includes 65 voltage values, the first level and the second level are two adjacent gamma voltages in gamma voltages GAMMA<65:1> selected by the digital to analog converter DAC based on DATA<7:2> in data DATA<7:0>. DATA<7:0> is an 8-bit digital signal, and DATA<7:2> is six most significant bits in DATA<7:0>. Based on data DATA<1:0>, the source operational amplifier SOP interpolates a data signal voltage V_DATA corresponding to a gray scale into the voltages of the first level and the second level, and outputs the voltages to the second N-type transistor N2. DATA<1:0> is two least significant bits in DATA<7:0>. The source operational amplifier SOP may be a multi-bit interpolation circuit or a unity-gain buffer circuit.

In a resetting phase t1 of working of the driving pixel circuit, a reset control signal output by an input terminal SA of a reset control signal has a high level, a switch control signal output by an input terminal SB1 of switch control has a low level, a scanning signal output by a scanning signal line WS has a low level, and a light-emitting control signal output by a light-emitting control signal line EMIT has a low level. In this case, the second N-type transistor N2, the fourth N-type transistor N4, the third P-type transistor P3, and the fourth P-type transistor P4 are turned on, and the data signal voltage V_DATA output by the SOP is written into a gate of the first N-type transistor N1 through the second N-type transistor N2, and is maintained by a capacitor. In addition, an initialization signal VREF_RST is written into the gate of the first P-type transistor P1 and an anode of the light-emitting device D1 through the fourth N-type transistor N4, to initialize the first P-type transistor P1 and the light-emitting device D1.

In a data writing phase t2 of working of the driving pixel circuit, a reset control signal output by the input terminal SA of a reset control signal has a low level, a switch control signal output by the input terminal SB1 of switch control has a high level, a scanning signal output by the scanning signal line WS has a low level, and a light-emitting control signal output by the light-emitting control signal line EMIT has a high level. In this case, the third N-type transistor N3, the third P-type transistor P3, and the fourth P-type transistor P4 are turned on, and a data signal current is generated by the first N-type transistor N1 based on the data signal voltage V_DATA of the gate, is written into the gate of the first P-type transistor P1 through the third N-type transistor N3, the third P-type transistor P3, and the fourth P-type transistor P4, and is maintained by the storage capacitor Cst.

In a light-emitting phase t3 of working of the driving pixel circuit, a reset control signal output by the input terminal SA of a reset control signal has a high level, a switch control signal output by the input terminal SB1 of switch control has a low level, a scanning signal output by the scanning signal line WS has a high level, and a light-emitting control signal output by the light-emitting control signal line EMIT has a low level. In this case, the second P-type transistor P2 is turned on, forming a data signal current path, and the first P-type transistor P1 outputs a data signal current to drive the light-emitting device D1 to emit light. In addition, the second N-type transistor N2 and the fourth N-type transistor N4 are turned on, preparing for outputting the data signal voltage V_DATA in a next frame.

It can be learned from the foregoing working process of the driving pixel circuit, the first N-type transistor N1 converts the data signal voltage V_DATA into a current, to provide the data signal current I_DATA for the pixel circuit. However, the first N-type transistor N1 has a threshold voltage, and therefore the data signal current I_DATA converted by the first N-type transistor N1 deviates from the data signal voltage V_DATA to some extent. Consequently, data signal currents I_DATA output by different circuits 10 to generate a data signal current are different, causing different luminosity of the light-emitting device, and resulting in poor uniformity of a display panel.

Figure 4:
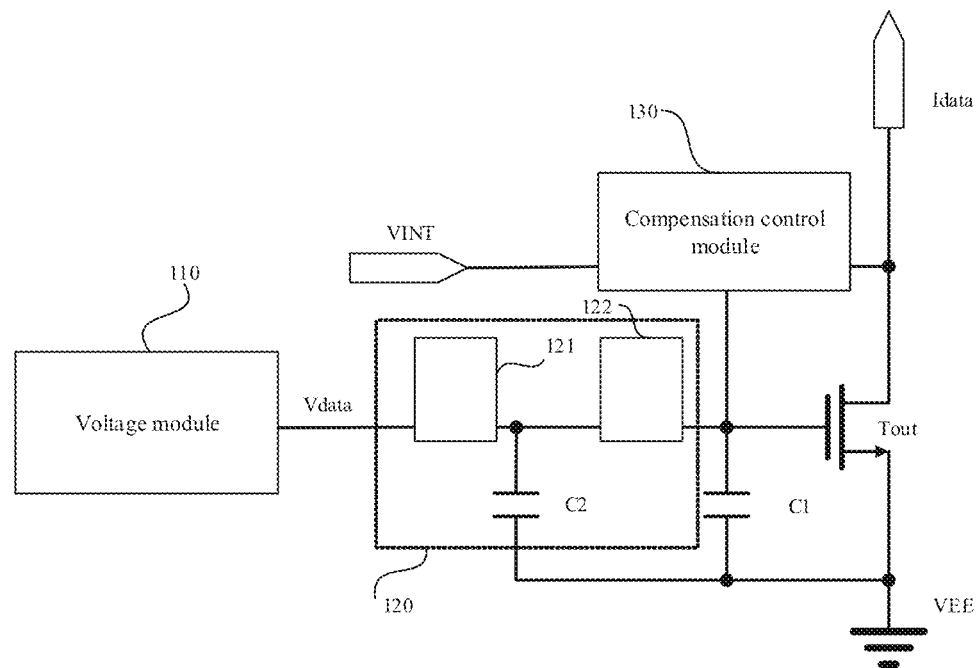
FIG. 4 is a schematic structural diagram of a circuit to generate a data signal current according to an embodiment of the present invention.

FIG. 4 is a schematic structural diagram of a circuit to generate a data signal current according to an embodiment of the present invention. As shown in FIG. 4, the circuit to generate a data signal current includes a voltage module 110 to generate a data signal voltage, a control module 120 to output a data signal voltage, a compensation control module 130, a first capacitor C1, and a current output transistor Tout. The voltage module 110 is connected to the control module 120, and is configured to output a data signal voltage Vdata to the control module 120. The control module 120 includes at least one second capacitor C2, a second terminal of the second capacitor C2 is connected to a first power supply terminal VEE of the circuit, and the second capacitor C2 is configured to store the data signal voltage Vdata. The control module 120 is connected to a gate of the current output transistor Tout, and is configured to output the data signal voltage Vdata to the gate of the current output transistor Tout. The compensation control module 130 is connected between the gate and a first terminal of the current output transistor Tout. The compensation control module 130 is configured to provide the gate of the current output transistor Tout with its own threshold voltage. A first terminal of the first capacitor C1 is connected to the gate of the current output transistor Tout, and a second terminal of the first capacitor C1 is connected to the first power supply terminal VEE, so that the first capacitor stores the voltage of the gate of the current output transistor Tout. The current output transistor Tout is configured to output a data signal current Idata based on the data signal voltage Vdata of its gate.

Specifically, the voltage module 110 outputs the data signal voltage Vdata. The control module 120 may include a first switch control unit 121 and a second switch control unit 122. States of the first switch control unit 121 and the second switch control unit 122 are opposite. To be specific, one of the first switch control unit 121 and the second switch control unit 122 is turned on, and the other is turned off. When the first switch control unit 121 is turned on, the second switch control unit 122 is turned off, the data signal voltage Vdata is provided to the second capacitor C2, and the second capacitor C2 maintains the data signal voltage Vdata. In addition, the compensation control module 130 firstly provides an initialization voltage input by the input terminal VINT of an initialization voltage to the gate of the current output transistor Tout, and the first capacitor C1 maintains the initialization voltage. Then, the compensation control module 130 controls the gate and a drain of the current output transistor Tout to be short-circuited, so that the current output transistor Tout forms a diode connection mode. The current output transistor Tout generates a current until the voltage of the gate of the current output transistor Tout drops to the threshold voltage Vth of the current output transistor Tout. In this case, the first capacitor C1 maintains the threshold voltage Vth of the current output transistor Tout. When the second switch control unit 122 is turned on, the first switch control unit 121 is turned off. The second capacitor C2 is connected to the first capacitor C1 in parallel, and is connected to the gate of the current output transistor Tout. Therefore, the voltage of the gate of the current output transistor Tout is a voltage stored after coupling of the second capacitor C2 and the first capacitor C1, and is (c2*Vdata+c1*Vth)/(c1+c2), where c1 represents a capacitance of the first capacitor, and c2 represents a capacitance of the second capacitor C2. When the capacitance of the first capacitor C1 is greater than the capacitance of the second capacitor C2, (c2*Vdata+c1*Vth)/(c1+c2) is approximately equal to (c2/c1)*Vdata+Vth. In this case, a current flowing through the current output transistor Tout is $$I = \frac{1}{2} * \mu_n * Cox * \frac{W}{L} * \left(\frac{c2}{c1} * Vdata\right)^2,$$

where $\mu_n$ represents carrier mobility of the current output transistor Tout, Cox represents a channel capacitance constant of the current output transistor Tout, W represents a channel width of the current output transistor Tout, and L represents a channel length of the current output transistor Tout. Therefore, the current generated by the current output transistor Tout is not affected by the threshold voltage Vth of the current output transistor Tout, and the data signal current Idata output by the circuit matches the data signal voltage Vdata, thereby improving uniformity of a display panel.

Figure 5:
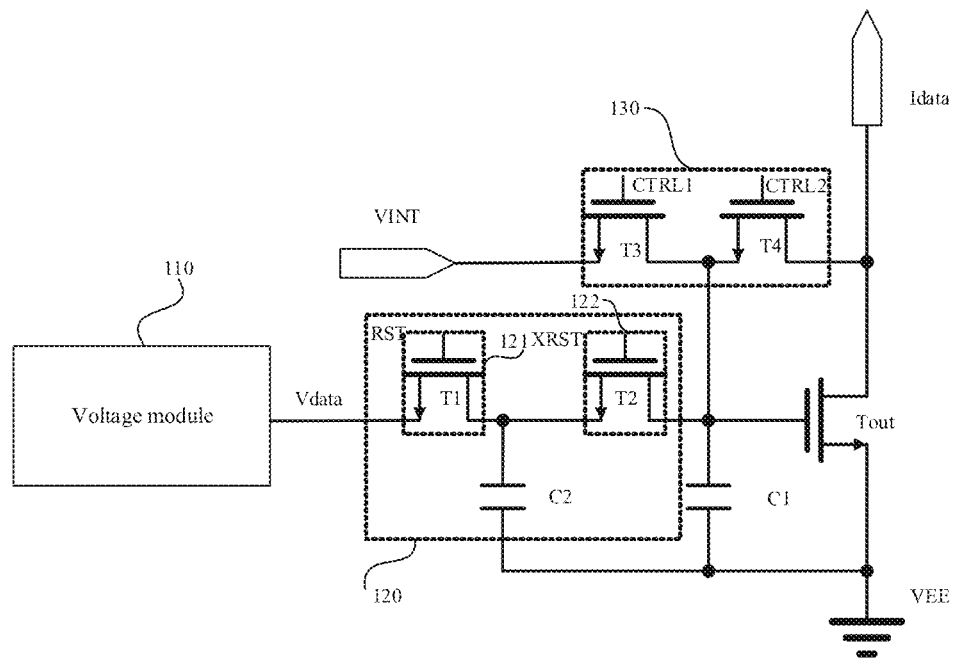
FIG. 5 is a schematic structural diagram of another circuit to generate a data signal current according to an embodiment of the present invention.

FIG. 5 is a schematic structural diagram of another circuit to generate a data signal current according to an embodiment of the present invention. As shown in FIG. 5, the control module to output a data signal voltage includes a first transistor T1, a second transistor T2, and one second capacitor C2. A gate of the first transistor T1 is connected to an input terminal of a reset control signal RST, a first terminal of the first transistor T1 is connected to the voltage module 110, and a second terminal of the first transistor T1 is connected to a first terminal of the second capacitor C2 and a first terminal of the second transistor T2, a gate of the second transistor T2 is connected to an input terminal of a reverse reset control signal XRST, and a second terminal of the second transistor T2 is connected to the gate of the current output transistor Tout.

Specifically, for example, both the first transistor T1 and the second transistor T2 shown in FIG. 5 are N-type transistors. A reset control signal input by the input terminal of a reset control signal RST and a reverse reset control signal input by the input terminal of a reverse reset control signal XRST are control signals having different levels (high or low). When the reset control signal input by the input terminal of a reset control signal RST has a high level, the reverse reset control signal input by the input terminal of a reverse reset control signal XRST has a low level. In this case, the first transistor T1 is turned on, and the second transistor T2 is turned off. When the reset control signal input by the input terminal of a reset control signal RST has a low level, the reverse reset control signal input by the input terminal of a reverse reset control signal XRST has a high level. In this case, the first transistor T1 is turned off, and the second transistor T2 is turned on.

Still referring to FIG. 5, the compensation control module 130 includes a third transistor T3 and a fourth transistor T4. A gate of the third transistor T3 is connected to an input terminal of a first control signal CTRL1, a first terminal of the third transistor T3 is connected to an input terminal VINT of an initialization voltage, a second terminal of the third transistor T3, a first terminal of the fourth transistor T4, and the first terminal of the first capacitor C1 are all connected to the gate of the current output transistor Tout, a gate of the fourth transistor T4 is connected to an input terminal of a second control signal CTRL2, and a second terminal of the fourth transistor T4 is connected to the first terminal of the current output transistor Tout.

Figure 6:
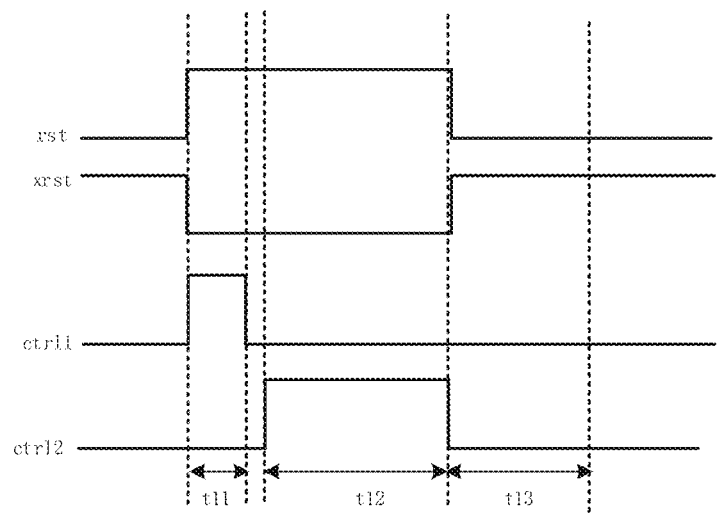
FIG. 6 is a sequence diagram of the circuit to generate a data signal current in FIG. 5.

FIG. 6 is a sequence diagram of the circuit in FIG. 5. In FIG. 6, rst represents a time sequence of the reset control signal input by the input terminal of a reset control signal RST, xrst represents a time sequence of the reverse reset control signal input by the input terminal of a reverse reset control signal XRST, ctrl1 represents a time sequence of a first control signal input by the input terminal of a first control signal CTRL1, and ctrl2 represents a time sequence of a second control signal input by the input terminal of a second control signal CTRL2. The following describes a working principle of the circuit to generate a data signal current with reference to FIG. 5 and FIG. 6 by using an example in which the first transistor T1, the second transistor T2, the third transistor T3, and the fourth transistor T4 are N-type transistors.

In a first phase t11, rst has a high level, xrst has a low level, ctrl1 has a high level, and ctrl2 has a low level. In this case, the first transistor T1 and the third transistor T3 are turned on. The data signal voltage Vdata output by the voltage module 110 is provided to the second capacitor C2 through the first transistor T1, and the second capacitor C2 stores the data signal voltage Vdata. In addition, the initialization voltage input by the input terminal VINT of an initialization voltage is provided to the gate of the current output transistor Tout through the third transistor T3, and the first capacitor C1 maintains the initialization voltage. For example, the initialization voltage is greater than the threshold voltage Vth of the current output transistor Tout.

In a second phase t12, rst has a high level, xrst has a low level, ctrl1 has a low level, and ctrl2 has a high level. In this case, the first transistor T1 and the fourth transistor T4 are turned on. The fourth transistor T4 is turned-on, and enables the gate and a drain of the current output transistor Tout to be short-circuited, so that the current output transistor Tout forms a diode connection mode. The current output transistor Tout generates a current until the voltage of the gate of the current output transistor Tout drops to the threshold voltage Vth of the current output transistor Tout. In this case, the first capacitor C1 maintains the threshold voltage Vth of the current output transistor Tout.

In a third phase t13, rst has a low level, xrst has a high level, ctrl1 has a low level, and ctrl2 has a low level. In this case, the second transistor T2 is turned on. The second capacitor C2 is connected to the first capacitor C1 in parallel, and is connected to the gate of the current output transistor Tout. The voltage of the gate of the current output transistor Tout is (c2*Vdata+c1*Vth)/(c1+c2), where c1 represents a capacitance of the first capacitor C1, and c2 represents a capacitance of the second capacitor C2. When the capacitance of the first capacitor C1 is greater than the capacitance of the second capacitor C2, (c2*Vdata+c1*Vth)/(c1+c2) is approximately equal to (c2/c1)*Vdata+Vth. In this case, a current flowing through the current output transistor Tout is $$I = \frac{1}{2} * \mu_n * Cox * \frac{W}{L} * \left(\frac{c2}{c1} * Vdata\right)^2.$$

Therefore, the current generated by the current output transistor Tout is not affected by the threshold voltage Vth of the current output transistor Tout, and the data signal current Idata output by the circuit matches the data signal voltage Vdata, thereby improving uniformity of a display panel.

Optionally, the capacitance of the first capacitor is greater than the capacitance of the second capacitor.

Specifically, when the second transistor T2 is turned on, the voltage of the gate of the current output transistor Tout is (c2*Vdata+c1*Vth)/(c1+c2). It can be learned that, the capacitance of the first capacitor is set to be greater than the capacitance of the second capacitor, so that c1*Vth/(c1+c2) is approximately equal to Vth as far as possible. Thus, the current of the current output transistor Tout is $$I = \frac{1}{2} * \mu_n * Cox * \frac{W}{L} * \left(\frac{c2}{c1} * Vdata\right)^2.$$

Preferably, the capacitance of the first capacitor is far greater than the capacitance of the second capacitor. For example, the capacitance of the first capacitor is one hundred times the capacitance of the second capacitor. In this way, the threshold voltage of the current output transistor Tout is better compensated, and the uniformity of the display panel is improved.

In addition, the current of the current output transistor Tout is $$I = \frac{1}{2} * \mu_n * Cox * \frac{W}{L} * \left(\frac{c2}{c1} * Vdata\right)^2.$$

Therefore, a proportional relationship between the current of the current output transistor Tout and the data signal voltage Vdata can be adjusted by adjusting a ratio of the capacitance c1 of the first capacitor to the capacitance c2 of the second capacitor. Therefore, when the current of the current output transistor Tout is maintained unchanged, a range of the data signal voltage Vdata can be increased by adjusting $$\frac{c2}{c1}.$$

Therefore, the range of the data signal voltage Vdata can be adjusted without changing the circuit.

Figure 7:
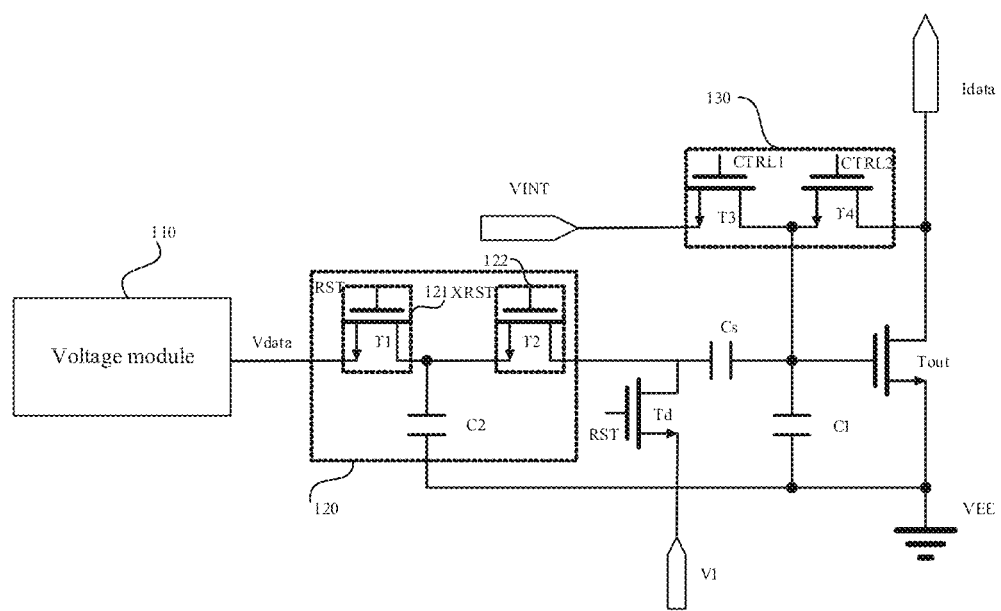
FIG. 7 is a schematic structural diagram of another circuit to generate a data signal current according to an embodiment of the present invention.

FIG. 7 is a schematic structural diagram of another circuit to generate a data signal current according to an embodiment of the present invention. As shown in FIG. 7, the circuit further includes a potential clamping transistor Td and a voltage divider capacitor Cs. The second terminal of the second transistor T2 is connected to the gate of the current output transistor Tout through the voltage divider capacitor Cs. A gate of the potential clamping transistor Td is connected to the input terminal of a reset control signal RST, a first terminal of the potential clamping transistor Td is connected to an input terminal of a first potential V1, a second terminal of the potential clamping transistor Td is connected to the second terminal of the second transistor T2 and a first terminal of the voltage divider capacitor Cs, and a second terminal of the voltage divider capacitor Cs is connected to the gate of the current output transistor Tout.

Specifically, the potential clamping transistor Td may be of the same type as the first transistor T1, and for example, may be an N-type transistor. Therefore, the potential clamping transistor Td and the first transistor T1 are simultaneously turned on or turned off. A first potential signal input by the input terminal of the first potential V1 may be a signal of any potential, and is used to clamp a potential of the first terminal of the voltage divider capacitor Cs, to prevent the first terminal of the voltage divider capacitor Cs from floating. For example, the input terminal of the first potential V1 is grounded, to avoid additional setting of a line connected to the input terminal of the first potential V1. A working principle of the circuit to generate a data signal current is described with reference to FIG. 6 and FIG. 7.

In a first phase t11, rst has a high level, xrst has a low level, ctrl1 has a high level, and ctrl2 has a low level. In this case, the first transistor T1, the third transistor T3, and the potential clamping transistor Td are turned on. The data signal voltage Vdata output by the voltage module 110 is provided to the second capacitor C2 through the first transistor T1, and the second capacitor C2 stores the data signal voltage Vdata. Moreover, the first potential signal input by the input terminal of the first potential V1 is used to clamp the potential of the first terminal of the voltage divider capacitor Cs, so that the potential of the first terminal of the voltage divider capacitor Cs is v1. In addition, the initialization voltage input by the input terminal of an initialization voltage VINT is provided to the gate of the current output transistor Tout through the third transistor T3, and the first capacitor C1 maintains the initialization voltage. For example, the initialization voltage is greater than the threshold voltage Vth of the current output transistor Tout.

In a second phase t12, rst has a high level, xrst has a low level, ctrl1 has a low level, and ctrl2 has a high level. In this case, the first transistor T1, the fourth transistor T4, and the potential clamping transistor Td are turned on. The fourth transistor T4 is turned on, so that the gate and a drain of the current output transistor Tout are short-circuited, and the current output transistor Tout forms a diode connection mode. The current output transistor Tout generates a current until the voltage of the gate of the current output transistor Tout drops to the threshold voltage Vth of the current output transistor Tout. In this case, the first capacitor C1 maintains the threshold voltage Vth of the current output transistor Tout, the potential of the first terminal of the voltage divider capacitor Cs is v1, and a potential of the second terminal of the voltage divider capacitor Cs is the threshold voltage Vth of the current output transistor Tout.

In a third phase t13, rst has a low level, xrst has a high level, ctrl1 has a low level, and ctrl2 has a low level. In this case, the second transistor T2 is turned on, and the potential clamping transistor Td is turned off. After being connected in series to the voltage divider capacitor Cs, the second capacitor C2 is connected to the first capacitor C1 in parallel, and is connected to the gate of the current output transistor Tout. The voltage of the gate of the current output transistor Tout is Vdata/(1+c2/c1+c2/cs)+Vth, where c1 represents a capacitance of the first capacitor C1, c2 represents a capacitance of the second capacitor C2, and cs represents a capacitance of the voltage divider capacitor Cs. In this case, a current flowing through the current output transistor Tout is $$I = \frac{1}{2} * \mu_n * Cox * \frac{W}{L} * \left(Vdata \Big/ \left(1 + \frac{c2}{c1} + \frac{c2}{cs}\right)\right)^2.$$

Therefore, the current generated by the current output transistor Tout is not affected by the threshold voltage Vth of the current output transistor Tout, and the data signal current Idata output by the circuit matches the data signal voltage Vdata, thereby improving uniformity of a display panel.

Figure 8:
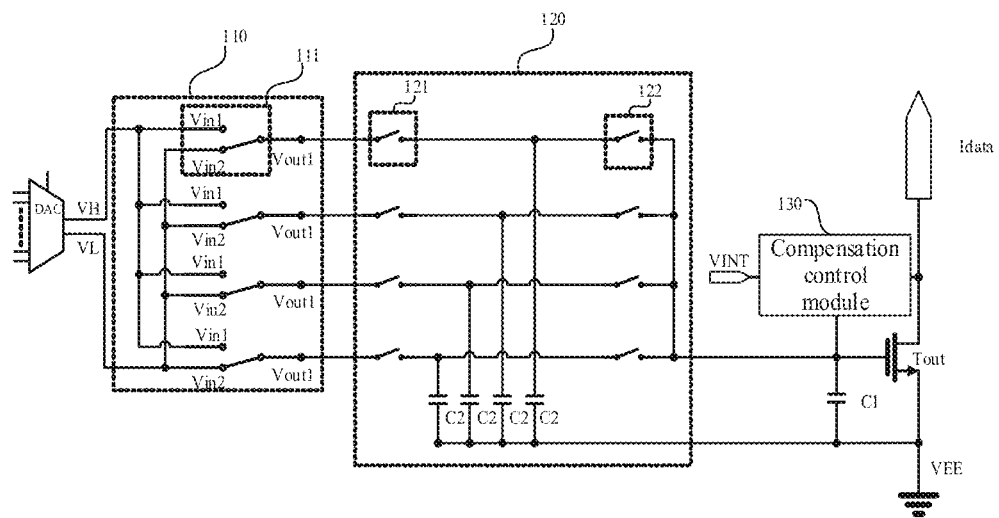
FIG. 8 is a schematic structural diagram of another circuit to generate a data signal current according to an embodiment of the present invention.

FIG. 8 is a schematic structural diagram of another circuit to generate a data signal current according to an embodiment of the present invention. As shown in FIG. 8, the voltage module 110 includes a plurality of dual-channel selectors 111, a first input terminal Vin1 of each dual-channel selector 111 is connected to an output terminal of a first level VH, a second input terminal Vin2 of each dual-channel selector is connected to an output terminal of second level VL, and an output terminal Vout1 of each dual-channel selector 111 is connected to an input terminal of the control module 120.

Specifically, the output terminal of the first level VH is configured to output a first level for the digital to analog converter DAC, and the output terminal of the second level VL is configured to output a second level for the digital to analog converter DAC. The digital to analog converter DAC is a circuit to output a gamma voltage, and therefore the first level and the second level are gamma voltages corresponding to a display panel. Optionally, the first level output by the output terminal of the first level VH and the second level output by the output terminal of the second level VL are adjacent gamma voltages. In the voltage module 110, the plurality of dual-channel selectors 111 divide the adjacent gamma voltages, so that a plurality of gray-scale voltages can be obtained from the adjacent gamma voltages through interpolation.

In FIG. 8, four dual-channel selectors 111 are shown as an example, and each dual-channel selector 111 can choose to output the first level or the second level. Therefore, the four dual-channel selectors 111 can output four data signal voltages Vdata in combination. Therefore, the voltage module 110 can obtain data signal voltages Vdata corresponding to four gray scales from the first level and the second level through interpolation.

It should be noted that FIG. 8 shows four dual-channel selectors 111 only as an example. In another embodiment, when the display panel has a fixed quantity of gray scales, and when a quantity of gamma voltages is small, data signal voltages Vdata corresponding to more gray scales need to be obtained from the adjacent gamma voltages through interpolation. In this case, the voltage module 110 may include more dual-channel selectors 111.

Still referring to FIG. 8, the control module 120 includes a plurality of first switches 121, a plurality of second capacitors C2, and a plurality of second switches 122. First terminals of the plurality of first switches 121 are respectively connected to the output terminals Vout1 of the dual-channel selectors 111, second terminals of the plurality of first switches 121 are respectively connected to first terminals of the plurality of second switches 122, second terminals of the plurality of second switches 122 are all connected to the gate of the current output transistor Tout, and first terminals of the plurality of second capacitors C2 are respectively connected to the second terminals of the plurality of first switches 121.

Specifically, FIG. 8 shows four dual-channel selectors 111 as an example. Accordingly, four first switches 121, four second capacitors C2, and four second switches 122 are included. The four first switches 121 are simultaneously turned on or turned off, and the four second switches 122 are simultaneously turned on or turned off. In addition, states of the first switches 121 and the second switches 122 are opposite. For example, turned-on or turned-off of the first switches 121 is controlled by a reset control signal input by the input terminal of a reset control signal, turned-on or turned-off of the second switches 122 is controlled by a reverse reset control signal input by the input terminal of a reverse reset control signal. When the first switches 121 are turned on, voltages output by the four dual-channel selectors 111 are stored in the four second capacitors C2. When the second switches 122 are turned on, the four second capacitors C2 are connected to the first capacitor C1 in parallel, and output stored voltages to the gate of the current output transistor Tout.

In addition, the voltages stored in the four second capacitors C2 are related to paths selected by the dual-channel selectors 111. For example, it is assumed that the first level is Vh and the second level is Vl. When output terminals Vout1 of the four dual-channel selectors 111 are all connected to second input terminals Vin2, and when the first switches 121 are turned on, all the four second capacitors C2 store the second level Vl. When the second switches 122 are turned on, the four capacitors are connected in parallel, and the data signal voltage output by the voltage module 110 is 4*Vl/4=Vl. In this case, a gate-source voltage of the current output transistor Tout is VGS=4*c1/c2*Vl.

When an output terminal Vout1 of one dual-channel selector 111 is connected to a first input terminal Vin1 and output terminals Vout1 of the other three dual-channel selectors 111 are all connected to second input terminals Vin2, and when the first switches 121 are turned on, one second capacitor C2 stores the first level Vh, and three second capacitors C2 store the second level Vl. When the second switches 122 are turned on, the four capacitors are connected in parallel, and the data signal voltage output by the voltage module 110 is (Vh+3*Vl)/4. In this case, the gate-source voltage of the current output transistor Tout is VGS=c1/c2*(3*Vl+Vh).

When output terminals Vout1 of two dual-channel selectors 111 are connected to first input terminals Vin1 and output terminals Vout1 of the other two dual-channel selectors 111 are both connected to second input terminals Vin2, and when the first switches 121 are turned on, two second capacitors C2 store the first level Vh, and two second capacitors C2 store the second level Vl. When the second switches 122 are turned on, the four capacitors are connected in parallel, and the data signal voltage output by the voltage module 110 is (2*Vh+2*Vl)/4. In this case, the gate-source voltage of the current output transistor Tout is VGS=c1/c2*(2*Vl+2*Vh).

When output terminals Vout1 of three dual-channel selectors 111 are connected to first input terminals Vin1 and an output terminal Vout1 of the other one dual-channel selector 111 is connected to a second input terminal Vin2, and when the first switches 121 are turned on, three second capacitors C2 store the first level Vh, and one second capacitor C2 stores the second level Vl. When the second switches 122 are turned on, the four capacitors are connected in parallel, and the data signal voltage output by the voltage module 110 is (3*Vh+Vl)/4. In this case, the gate-source voltage of the current output transistor Tout is VGS=c1/c2*(Vl+3*Vh).

It can be learned that, the voltage module includes a plurality of dual-channel selectors and outputs different level values through the plurality of dual-channel selectors 111, and then the control module uses second capacitors to store the different level values. In this way, the control module outputs different data signal voltages, so that data signal voltages are obtained from gamma voltages through interpolation. Compared with a voltage module and a control module to in the existing technologies, the voltage module and the control module in the technical solutions in the present invention only need simple components to implement an interpolation function, and occupy a relatively small area. Therefore, an area occupied by the circuit can be reduced. When the circuit is integrated into a data driving circuit and disposed in a non-display area of the display panel, an area of the display panel occupied by the data driving circuit is reduced, thereby facilitating a narrow frame design of the display panel.

Figure 9:
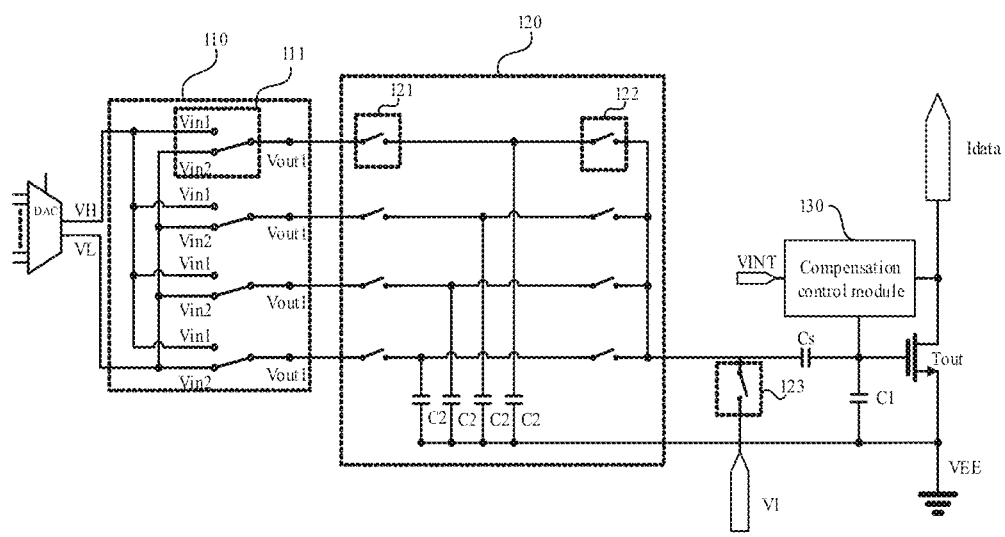
FIG. 9 is a schematic structural diagram of another circuit to generate a data signal current according to an embodiment of the present invention.

FIG. 9 is a schematic structural diagram of another circuit to generate a data signal current according to an embodiment of the present invention. As shown in FIG. 9, the circuit further includes a third switch 123 and a voltage divider capacitor Cs. The second terminals of the plurality of second switches 122 are all connected to the gate of the current output transistor Tout through the voltage divider capacitor Cs. A first terminal of the third switch 123 is connected to an input terminal of a first potential signal V1, and a second terminal of the third switch 123 is connected to the second terminal of the second switch 122 and a first terminal of the voltage divider capacitor Cs.

Specifically, a first potential signal V1 input by its input terminal may be a signal of any potential, and is used to clamp a potential of the first terminal of the voltage divider capacitor Cs, to prevent the first terminal of the voltage divider capacitor Cs from floating. The third switch 123 and the first switch 121 may be simultaneously turned on or turned off. It is assumed that the first level is Vh and the second level is Vl. The data signal voltage output by the voltage module 110 is analyzed below.

When output terminals Vout1 of the four dual-channel selectors 111 are all connected to second input terminals Vin2, and when the first switches 121 are turned on, all the four second capacitors C2 store the second level Vl. When the second switches 122 are turned on, the four capacitors are connected in parallel, and the data signal voltage output by the voltage module 110 is 4*Vl/4=Vl. In this case, a gate-source voltage of the current output transistor Tout is VGS=Vl/(1+c2/c1+c2/cs).

When an output terminal Vout1 of one dual-channel selector 111 is connected to a first input terminal Vin1 and output terminals Vout1 of the other three dual-channel selectors 111 are all connected to second input terminals Vin2, and when the first switches 121 are turned on, one second capacitor C2 stores the first level Vh, and three second capacitors C2 store the second level Vl. When the second switches 122 are turned on, the four capacitors are connected in parallel, and the data signal voltage output by the voltage module 110 is (Vh+3*Vl)/4. In this case, the gate-source voltage of the current output transistor Tout is VGS=(3*Vl+Vh)/[4*(1+c2/c1+c2/cs)].

When output terminals Vout1 of two dual-channel selectors 111 are connected to first input terminals Vin1 and output terminals Vout1 of the other two dual-channel selectors 111 are both connected to second input terminals Vin2, and when the first switches 121 are turned on, two second capacitors C2 store the first level Vh, and two second capacitors C2 store the second level Vl. When the second switches 122 are turned on, the four capacitors are connected in parallel, and the data signal voltage output by the voltage module 110 is (2*Vh+2*Vl)/4. In this case, the gate-source voltage of the current output transistor Tout is VGS=(2*Vl+2*Vh)/[4*(1+c2/c1+c2/cs)].

When output terminals Vout1 of three dual-channel selectors 111 are connected to first input terminals Vin1 and an output terminal Vout1 of the other one dual-channel selector 111 is connected to a second input terminal Vin2, and when the first switches 121 are turned on, three second capacitors C2 store the first level Vh, and one second capacitor C2 stores the second level Vl. When the second switches 122 are turned on, the four capacitors are connected in parallel, and the data signal voltage output by the voltage module 110 is (3*Vh+Vl)/4. In this case, the gate-source voltage of the current output transistor Tout is VGS=(Vl+3*Vh)/[4*(1+c2/c1+c2/cs)].

Similarly, the voltage module and the control module to output a signal voltage in the technical solutions in the present invention only need simple components to implement an interpolation function, and occupy a relatively small area. Therefore, an area occupied by the circuit to generate a data signal current can be reduced. When the circuit is integrated into a data driving circuit and disposed in a non-display area of the display panel, an area of the display panel occupied by the data driving circuit is reduced, thereby facilitating a narrow frame design of the display panel.

An embodiment of the present invention further provides a chip to drive a data signal current. The chip to drive a data signal current includes the circuit to generate a data signal current provided in any embodiment of the present invention, and therefore has all technical features of the circuit provided in any embodiment of the present invention, and further has beneficial effects of the circuit provided in any embodiment of the present invention. Details are not described herein again.

Figure 10:
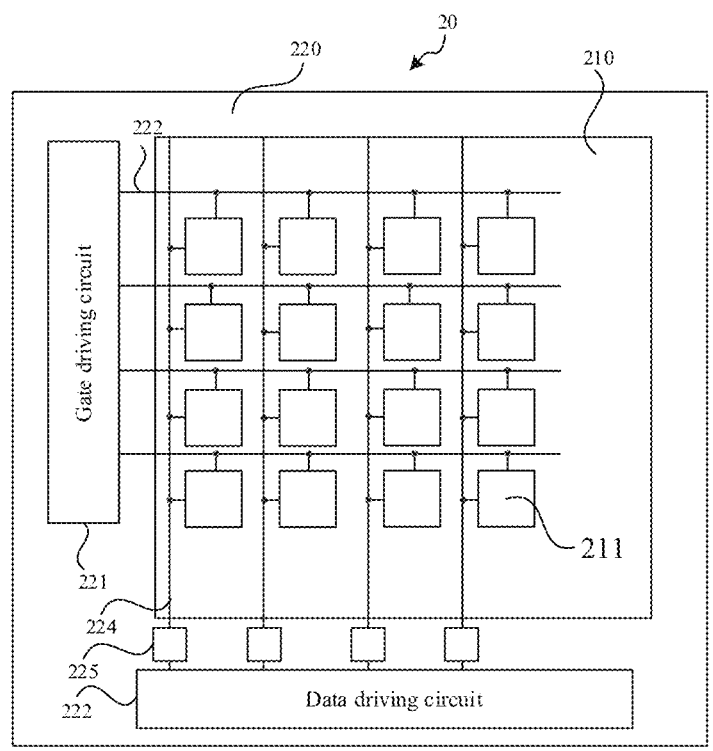
FIG. 10 is a schematic structural diagram of a display panel according to an embodiment of the present invention.

An embodiment of the present invention further provides a display panel. FIG. 10 is a schematic structural diagram of a display panel according to an embodiment of the present invention. As shown in FIG. 10, the display panel 20 includes a display area 210 and a non-display area 220. The display area 210 is provided with a plurality of pixel circuits, and the non-display area 220 is provided with the circuit to generate a data signal current provided in any embodiment of the present invention. The pixel circuits are connected to the circuit to generate a data signal current through data lines 224 and switch modules 225. The circuit provides data signal currents for the pixel circuits through the data lines 224 and the switch modules 225.

Specifically, the display area 210 includes a plurality of pixel units 211, and each pixel unit 211 includes one pixel circuit. The non-display area 220 includes a gate driving circuit 221 and a data driving circuit 222. The gate driving circuit 221 provides scanning signals for the pixel circuits through scanning lines 223, and the data driving circuit 222 provides data signal currents for the pixel circuits through data lines 224. Under action of the scanning signals, the pixel circuits are connected to corresponding data signal lines 224. When the switch modules 225 are turned on, the data signal lines 224 obtain data signal currents from the circuit to generate a data signal current in the data driving circuit 222, and transmit the data signal currents to the pixel circuits. Based on this, the pixel circuits implement display of the display panel.

Figure 11:
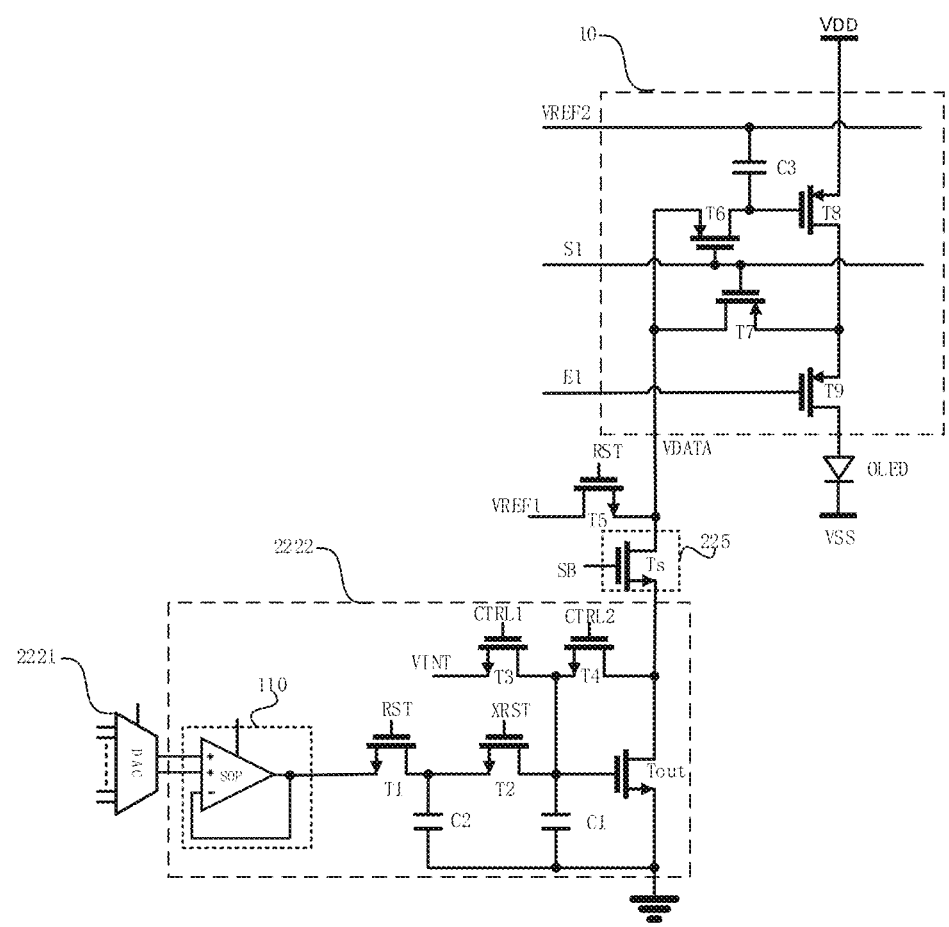
FIG. 11 is a schematic structural diagram of a data driving circuit that provides a driving data signal current for a pixel circuit according to an embodiment of the present invention.

For example, FIG. 11 is a schematic structural diagram of a data driving circuit that provides a driving data signal current for a pixel circuit according to an embodiment of the present invention. With reference to FIG. 10 and FIG. 11, the display panel further includes a fifth transistor T5, and the switch module 225 includes a switch transistor Ts. A gate of the fifth transistor T5 is connected to an input terminal of a reset control signal RST, a first terminal of the fifth transistor T5 is connected to an input terminal of a reference voltage VREF_RST of the pixel circuit, and a second terminal of the fifth transistor T5 is connected to an input terminal of a data signal current VDATA of the pixel circuit. A gate of the switch transistor Ts is connected to an input terminal of a switch control signal SB of the pixel circuit, a first terminal of the switch transistor Ts is connected to a first terminal of a current conversion transistor Tout of the circuit to generate a data signal current, and a second terminal of the switch transistor Ts is connected to the input terminal of a data signal current VDATA of the pixel circuit.

Specifically, when a switch control signal input by the input terminal of a switch control signal SB controls the switch transistor Ts to be turned on, a data signal current output by the current output transistor Tout is provided to the pixel circuit through the input terminal of a data signal current VDATA of the pixel circuit.

Still referring to FIG. 11, the pixel circuit includes a sixth transistor T6, a seventh transistor T7, an eighth transistor T8, a ninth transistor T9, a third capacitor C3, and a light-emitting device OLED. A first terminal of the sixth transistor T6 and a first terminal of the seventh transistor T7 are connected to the input terminal of a data signal current VDATA of the pixel circuit, a second terminal of the sixth transistor T6 is connected to a gate of the eighth transistor T8 and a first terminal of the third capacitor C3, a gate of the sixth transistor T6 and a gate of the seventh transistor T7 are connected to an input terminal of a scanning signal S1 of the pixel circuit, a second terminal of the seventh transistor T7 is connected to a second terminal of the eighth transistor T8, and a first terminal of the eighth transistor T8 is connected to a input terminal of a first power signal VDD of the pixel circuit. A second terminal of the third capacitor C3 is connected to a second input terminal of a reference voltage VREF2 of the pixel circuit, the second terminal of the eighth transistor T8 is connected to a first terminal of the ninth transistor T9, a gate of the ninth transistor T9 is connected to an input terminal of a light-emitting control signal E1 of the pixel circuit, a second terminal of the ninth transistor T9 is connected to an anode of the light-emitting device OLED, and a cathode of the light-emitting device OLED is connected to an input terminal of a second power signal VSS of the pixel circuit.

FIG. 12 is a sequence diagram of the circuit to generate a data signal current in FIG. 11. In FIG. 12, rst represents a time sequence of a reset control signal input by the input terminal of a reset control signal RST, xrst represents a time sequence of a reverse reset control signal input by an input terminal of a reverse reset control signal XRST, ctrl1 represents a time sequence of a first control signal input by a input terminal of a first control signal CTRL1, ctrl2 represents a time sequence of a second control signal input by a input terminal of a second control signal CTRL2, sb represents a time sequence of the switch control signal input by the input terminal of a switch control signal SB, s1 represents a time sequence of a scanning signal input by the input terminal of a scanning signal S1, and e1 represents a time sequence of a light-emitting control signal input by the input terminal of a light-emitting control signal E1. A working principle of FIG. 11 is specifically described below with reference to FIG. 11 and FIG. 12.

It should be noted that the data driving circuit 222 includes a digital to analog converter circuit 2221 and a circuit 2222 to generate a data signal current. The digital to analog converter circuit 2221 provides a gamma voltage for the circuit 2222 to generate a data signal current. A voltage module 110 in the circuit 2222 to generate a data signal current generates and outputs a data signal voltage.

In a first phase t21, rst has a high level, xrst has a low level, ctrl1 has a high level, ctrl2 has a low level, sb has a low level, e1 has a low level, and s1 has a low level. In this case, the first transistor T1, the third transistor T3, the fifth transistor T5, the sixth transistor T6, the seventh transistor T7, and the ninth transistor T9 are turned on. The data signal voltage output by the voltage module 110 is provided to a second capacitor C2 through the first transistor T1, and the second capacitor C2 stores the data signal voltage. An initialization voltage input by an input terminal of an initialization voltage VINT is provided to a gate of a current output transistor Tout through the third transistor T3, and a first capacitor C1 maintains the initialization voltage. In addition, a first reference voltage is provided to the gate of the eighth transistor T8 and the anode of the light-emitting device OLED through the fifth transistor T5, the sixth transistor T6, and the seventh transistor T7, to initialize the gate of the eighth transistor T8 and the anode of the light-emitting device OLED.

In a second phase t22, rst has a high level, xrst has a low level, ctrl1 has a low level, ctrl2 has a high level, sb has a low level, e1 has a low level, and s1 has a low level. In this case, the first transistor T1, the fourth transistor T4, the fifth transistor T5, the sixth transistor T6, the seventh transistor T7, and the ninth transistor T9 are turned on. Turned-on of the fourth transistor T4 enables the gate and a drain of the current output transistor Tout to be short-circuited, so that the current output transistor Tout forms a diode connection mode. The current output transistor Tout generates a current until a voltage of the gate of the current output transistor Tout drops to a threshold voltage of the current output transistor Tout. In this case, the first capacitor C1 maintains the threshold voltage of the current output transistor Tout.

In a third phase t23, rst has a low level, xrst has a high level, ctrl1 has a low level, ctrl2 has a low level, sb has a high level, e1 has a high level, and s1 has a low level. In this case, the second transistor T2, the switch transistor Ts, the sixth transistor T6, and the seventh transistor T7 are turned on. The data signal voltage and the threshold voltage of the current output transistor Tout are provided to the gate of the current output transistor Tout, and the current output transistor Tout is enabled to be turned on. The current output transistor Tout generates a data signal current based on the voltage of the gate of the current output transistor Tout, and the data signal current is provided to the gate of the eighth transistor T8 through the switch transistor Ts, the sixth transistor T6, and the seventh transistor T7, and is maintained by the third capacitor C3.

In a fourth phase t24, rst has a high level, xrst has a low level, ctrl1 has a high level, ctrl2 has a low level, sb has a low level, e1 has a low level, and s1 has a high level. In this case, the first transistor T1, the third transistor T3, and the ninth transistor T9 are turned on, forming a data signal current path. The eighth transistor T8 outputs the data signal current to the light-emitting device OLED through the ninth transistor T9. Responding to the data signal current, the light-emitting device OLED emits light. In addition, the first transistor T1 and the third transistor T3 are turned on, preparing for outputting the data signal voltage in a next frame.

An embodiment of the present invention further provides a method for driving a circuit to generate a data signal current. The method is used to drive the circuit to generate a data signal current provided in any embodiment of the present invention. FIG. 13 is a flowchart of a method for driving a circuit to generate a data signal current according to an embodiment of the present invention. As shown in FIG. 13, the driving method includes the following:

S31. In a first phase, a voltage module of the circuit to generate a data signal current is controlled to output a data signal voltage to a control module to output a data signal voltage, and a compensation control module is controlled to provide a threshold voltage of a current output transistor to a gate of the current output transistor.

S32. In a second phase, the control module to output a data signal voltage is controlled to output the data signal voltage to the gate of the current output transistor, and the current output transistor outputs a driving data current based on the data signal voltage of the gate.

It should be noted that only exemplary embodiments of the present invention and applied technical principles are described above, and a person skilled in the art can make various variations, adjustments, and replacements without departing from the scope of the present invention. Therefore, although the present invention is described in detail through the foregoing embodiments, the present invention is not limited to the foregoing embodiments. Other embodiments may be used without departing from the scope and concept of the present invention as set forth in the following claims.

What is claimed is:

1. A circuit to generate a data signal current, comprising a voltage circuit to generate a data signal voltage, a control circuit to output the data signal voltage, a compensation control circuit, a first capacitor, and a current output transistor, wherein
the voltage circuit is connected to the control circuit, and is configured to output the data signal voltage to the control circuit; the control circuit comprises at least one second capacitor, a second terminal of the second capacitor is connected to a first power supply terminal of the circuit, and the second capacitor is configured to store the data signal voltage;
the control circuit is connected to a gate of the current output transistor, and is configured to output the data signal voltage to the gate of the current output transistor; and
the compensation control circuit is connected between the gate and a first terminal of the current output transistor; the compensation control circuit is configured to provide the gate of the output transistor with its own threshold voltage; a first terminal of the first capacitor is connected to the gate of the current output transistor, and a second terminal of the first capacitor is connected to the first power supply terminal, so that the first capacitor stores a voltage of the gate of the current output transistor; and the current output transistor is configured to output a current corresponding to the data signal voltage of its gate and the data signal current generated by the current output transistor is configure for driving a pixel circuit through the first terminal of the current output transistor;
wherein the voltage circuit comprises a plurality of dual-channel selecting circuits, a first input terminal of each dual-channel selecting circuit is connected to a first level output terminal, a second input terminal of each dual-channel selecting circuit is connected to a second level output terminal, and an output terminal of each dual-channel selecting circuit is connected to an input terminal of the control circuit;
wherein the control circuit comprises a plurality of first switches, a plurality of second capacitors and a plurality of second switches, first terminals of the plurality of second capacitors are respectively connected to second terminals of the plurality of first switches and second terminals of the plurality of second capacitors are directly connected to a second terminal the current output transistor.

2. The circuit according to claim 1, wherein a first level output by the first level output terminal a gamma voltage lies closest to a second level output by the second level output terminal.

3. The circuit according to claim 1, wherein
first terminals of the plurality of first switches are respectively connected to the output terminals of the dual-channel selecting circuits, the second terminals of the plurality of first switches are respectively connected to first terminals of the plurality of second switches, second terminals of the plurality of second switches are all connected to the gate of the current output transistor.

4. The circuit according to claim 3, further comprising a third switch and a voltage divider capacitor, wherein the second terminals of the plurality of second switches are all connected to the gate of the current output transistor through the voltage divider capacitor; and
a first terminal of the third switch is connected to a first potential input terminal, and a second terminal of the third switch is connected to the second terminal of the second switch and a first terminal of the voltage divider capacitor.

5. A display panel, comprising a display area and a non-display area, wherein the display area is provided with a plurality of pixel circuits, and the non-display area is provided with the circuit according to claim 1; the pixel circuits are connected to the circuit through data lines and switch modules; and the circuit provides data signal currents for the pixel circuits through the data lines and the switch modules; and
further comprising a fifth transistor, wherein the switch module comprises a switch transistor; and
a gate of the fifth transistor is connected to an input terminal of a reset control signal, a first terminal of the fifth transistor is connected to a first input terminal of a reference voltage of the pixel circuit, and a second terminal of the fifth transistor is connected to an input terminal of a data signal current of the pixel circuit; and a gate of the switch transistor is connected to an input terminal of a switch control signal of the pixel circuit, a first terminal of the switch transistor is connected to a first terminal of a current conversion transistor of the circuit, and a second terminal of the switch transistor is connected to the input terminal of a data signal current of the pixel circuit; and the pixel circuit comprises a sixth transistor, a seventh transistor, an eighth transistor, a ninth transistor, a third capacitor, and a light-emitting device; and a first terminal of the sixth transistor and a first terminal of the seventh transistor are connected to the input terminal of a data signal current of the pixel circuit, a second terminal of the sixth transistor is connected to a gate of the eighth transistor and a first terminal of the third capacitor, a gate of the sixth transistor and a gate of the seventh transistor are connected to an input terminal of a scanning signal of the pixel circuit, a second terminal of the seventh transistor is connected to a second terminal of the eighth transistor, and a first terminal of the eighth transistor is connected to a first input terminal of a power signal of the pixel circuit; and a second terminal of the third capacitor is connected to a second input terminal of a reference voltage of the pixel circuit, the second terminal of the eighth transistor is connected to a first terminal of the ninth transistor, a gate of the ninth transistor is connected to an input terminal of a light-emitting control signal of the pixel circuit, a second terminal of the ninth transistor is connected to an anode of the light-emitting device, and a cathode of the light-emitting device is connected to a second input terminal of a power signal of the pixel circuit.

\* \* \* \* \*